(12) United States Patent
Pellizzer et al.

(10) Patent No.: US 7,307,451 B2
(45) Date of Patent: Dec. 11, 2007

(54) FIELD PROGRAMMABLE GATE ARRAY DEVICE

(75) Inventors: Fabio Pellizzer, Follina (IT); Guido De Sandre, Brugherio (IT); Roberto Bez, Milan (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 88 days.

(21) Appl. No.: 10/948,079

(22) Filed: Sep. 23, 2004

(65) Prior Publication Data

US 2005/0062497 A1 Mar. 24, 2005

(30) Foreign Application Priority Data

Sep. 23, 2003 (EP) ................... 03021455

(51) Int. Cl.
*H03K 19/177* (2006.01)
*G11C 11/34* (2006.01)

(52) U.S. Cl. ............. 326/41; 326/37; 326/38; 326/47; 365/185.07; 365/185.08

(58) Field of Classification Search ............. 326/37–41, 326/47; 365/228, 175, 185.08

See application file for complete search history.

(56) References Cited

U.S. PATENT DOCUMENTS

| | | | | | |
|---|---|---|---|---|---|
| 5,058,074 A | * | 10/1991 | Sakamoto | ................... | 365/228 |
| 5,371,422 A | * | 12/1994 | Patel et al. | ................... | 326/41 |
| 5,440,182 A | * | 8/1995 | Dobbelaere | ................... | 326/38 |
| 5,581,501 A | * | 12/1996 | Sansbury et al. | ...... | 365/185.01 |
| 6,002,268 A | * | 12/1999 | Sasaki et al. | ................ | 326/41 |
| 6,029,236 A | * | 2/2000 | Steele et al. | ................ | 711/170 |
| 6,058,041 A | * | 5/2000 | Golke et al. | ................ | 365/156 |
| 6,072,716 A | | 6/2000 | Jacobson et al. | ........... | 365/163 |
| 6,097,988 A | * | 8/2000 | Tobias | ........................ | 700/23 |
| 6,130,550 A | * | 10/2000 | Zaliznyak et al. | ............ | 326/39 |
| 6,337,579 B1 | | 1/2002 | Mochida | ..................... | 326/41 |
| 6,356,478 B1 | | 3/2002 | McCollum | ............ | 365/185.01 |
| 6,426,891 B1 | * | 7/2002 | Katori | ........................ | 365/175 |
| 6,590,807 B2 | * | 7/2003 | Lowrey | ..................... | 365/175 |
| 6,594,192 B1 | * | 7/2003 | McClure | .................. | 365/225.7 |
| 6,696,855 B1 | * | 2/2004 | Kapusta et al. | ............... | 326/39 |
| 2003/0071651 A1 | * | 4/2003 | Vora | ............................. | 326/38 |
| 2004/0141363 A1 | * | 7/2004 | Ohtsuka et al. | ............. | 365/154 |

\* cited by examiner

*Primary Examiner*—Rexford Barnie
*Assistant Examiner*—Jason Crawford
(74) *Attorney, Agent, or Firm*—Lisa K. Jorgenson; David V. Carlson; Seed IP Law Group PLLC

(57) ABSTRACT

The present invention proposes a Field Programmable Gate Array device comprising a plurality of configurable electrical connections, a plurality of controlled switches, each one adapted to activating/de-activating at least one respective electrical connection in response to a switch control signal and a control unit including an arrangement of a plurality of control cells. Each control cells controls at least one of said controlled switches by the respective switch control signal, each control cell including a volatile storage element adapted to storing in a volatile way a control logic value corresponding to a preselected status of the at least one controlled switch, and providing to the controlled switch said switch control signal corresponding to the stored logic value. Each control cell further includes a non-volatile storage element coupled to the volatile storage element, the non-volatile storage element being adapted to storing in a non-volatile way the control logic value.

25 Claims, 5 Drawing Sheets

FIELD PROGRAMMABLE GATE ARRAY DEVICE

BACKGROUND OF THE INVENTION

1. Field of the Invention

The present invention relates to a Field Programmable Gate Array (FPGA) device.

2. Description of the Related Art

The FPGA devices are programmable logic devices that provide an array of generic combinational and/or sequential logic elements that can be programmed and interconnected to each other by the user to realize a wide variety of logic circuit designs.

Many of the new FPGA architectures are based on semiconductor memory technology, and particularly on electrically alterable semiconductor memories, making use of floating gate MOSFETs and RAM cells; this means that a new computational architecture can be implemented by the FPGA device by simply re-programming the logic functions and interconnection routing on the chip.

Although FPGA devices have been traditionally used to integrate glue logic, the interest towards the possible applications of the FPGA devices is increasingly growing because of their short development time, low costs of production and request of few resources dedicated to simulation and to re-programmability during project flow and utilization. Thanks to their great flexibility, the FPGA devices are gaining more visibility, for example, in telecommunications and networking, where however also a high operation speed is very attractive.

Referring to FIG. 1A, a schematic block diagram of an exemplary FPGA device 100 is shown. The FPGA device 100 is provided with a plurality of programmable input/output blocks (IOB) 105 for receiving/sending signals, and a plurality of programmable logic blocks (LB) 110, comprising combinational and/or sequential logic elements. The FPGA device 100 includes electrical interconnection segments (conductive lines) 115 and programmable switch blocks (SB) 120 for activating/de-activating interconnections between the blocks 105, 110.

The switch blocks 120 include a plurality of controlled electronic switches, such as voltage controlled MOS transistors in transmission gate configuration (often called pass transistors). The controlled electronic switches are connected between two or more conductive lines 115, which are connected to the blocks 105, 110 and/or to further switch blocks 120. The plurality of electronic switches is disposed in such a way that it is possible to configure different paths of interconnections; consequently, the input/output blocks 105 are connectable to desired logic blocks 110, and predetermined logic blocks 110 are connectable to specified further logic blocks 110. In particular, each electronic switch is controlled by respective control signals, provided by a FPGA control unit 125, for activating/de-activating the selected interconnections; in this way, it is possible to implement a given function by properly connecting to each other desired blocks 105, 110, and it is possible to properly program the FPGA device 100 so as to permit the execution of required operations.

As depicted schematically in FIG. 1B, the control unit 125, embedded in the FPGA device 100 (i.e., integrated in a same semiconductor chip with the input/output blocks 105, the logic blocks 110, the interconnection segments 115 and the switch blocks 120), typically comprises a volatile memory device 135 for storing configuration logic values corresponding to the open status or the closed status of each electronic switch of the switch blocks 120. The volatile memory device 135, preferably a Static RAM memory (SRAM-based FPGA device), may consist in a two-dimensional arrangement (a matrix) of a plurality of volatile memory cells. Each volatile memory cell provides the respective control signal to at least one electronic switch, accordingly to the stored configuration logic value, for activating/de-activating the selected interconnections of the FPGA device 100.

The possibility of re-programming the volatile memory device (a RAM memory can be re-configured dynamically) permits new configurations of the interconnections of the FPGA device 100. However, the configuration logic values cannot be preserved in a volatile memory device during stand-by or, generally, when the device is not powered. Non-volatility is desirable for many applications of the FPGA devices, but a non-volatile memory device, such as a flash memory implemented by floating gate transistors, has a longer access time and greater power consumption than a volatile memory device.

For benefiting of the different properties of both volatile and non-volatile memories, the FPGA device 100 is usually associated with a non-volatile memory device 130 (schematically shown in dash-and-dot lines in FIG. 1B); a stand-alone memory integrated in a chip different than that of the FPGA device, for storing the configuration logic values also during stand-by or power-down. In this way, the non-volatile memory device 130 acts as a back-up storage unit in respect of the volatile memory device 135.

The non-volatile memory device 130, preferably an electrically alterable memory device (for example, a flash memory), non-volatily stores information corresponding to the configuration logic values for the electronic switches. At the power-on of the FPGA device 100 a power-on circuit 140, depicted in FIG. 1B as included in the FPGA control unit 125, enables the transfer of the information stored in the non-volatile memory device 130 into the volatile memory device 135. Accordingly to the stored configuration logic value, each volatile memory cell provides the control signal to the respective electronic switch.

The use of two different semiconductor chips, one for the FPGA device and one for the back-up non-volatile memory device, is disadvantageous, because very complex and expensive. A wide area on the printed circuit board is to be reserved and interconnections between the two chips are to be provided.

BRIEF SUMMARY OF THE INVENTION

A FPGA device as set out in the appended claims is proposed.

Summarizing, according to one embodiment, the present invention provides a Field Programmable Gate Array (FPGA) device comprising a plurality of configurable electrical connections, a plurality of controlled switches, each one adapted to activating/de-activating at least one respective electrical connection in response to a switch control signal, and a control unit including an arrangement of a plurality of control cells. Each control cell controls at least one of said controlled switches by the respective switch control signal, each control cell including a volatile storage element adapted to storing in a volatile way a control logic value corresponding to a preselected status of the at least one controlled switch, and providing to the controlled switch said switch control signal corresponding to the stored logic value. Each control cell further includes a non-volatile storage element coupled to the volatile storage element, the non-volatile storage element being adapted to storing in a non-volatile way the control logic value.

Moreover, a corresponding method of driving at least one controlled switch of a Field Programmable Gate Array device is also encompassed, as set forth in the appended method claims.

BRIEF DESCRIPTION OF THE SEVERAL VIEWS OF THE DRAWING(S)

Further features and the advantages of the present invention will be made clear by the following description of some embodiments thereof, provided purely by way of non-limitative example, description that will be conducted making reference to the attached drawings, wherein.

DETAILED DESCRIPTION OF THE INVENTION

Figure 2A:
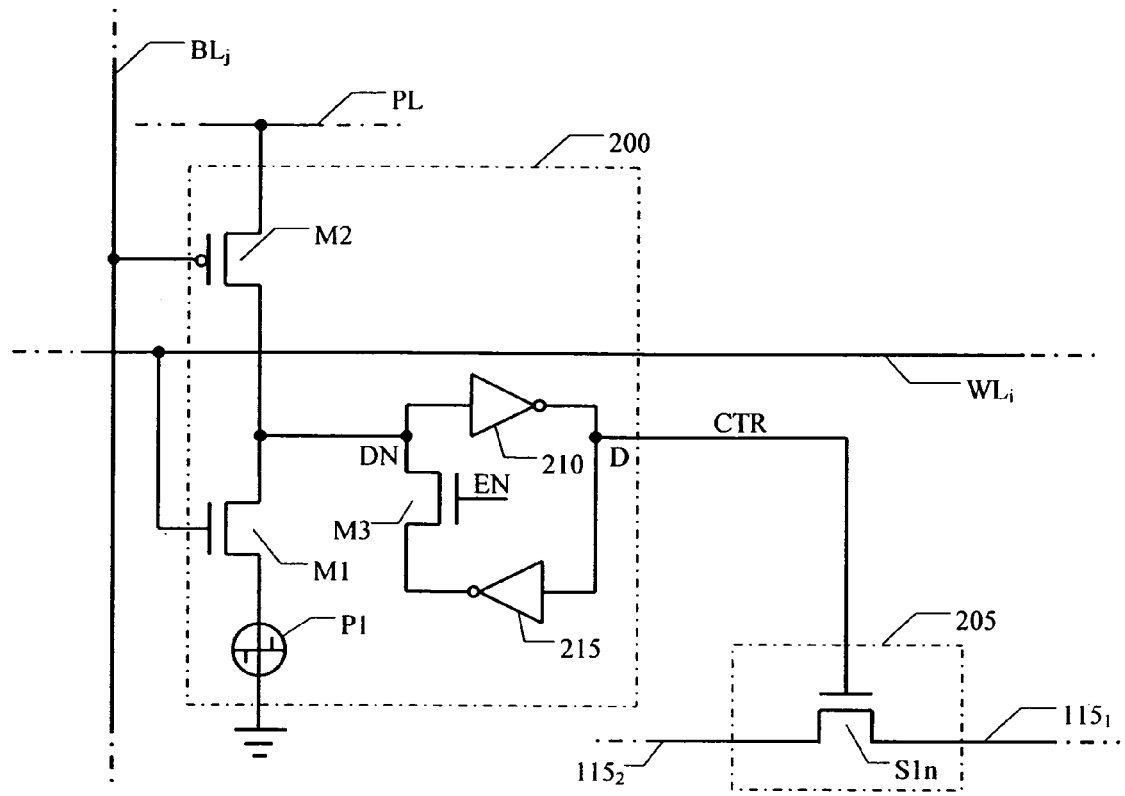
FIG. 2A shows a control cell of a control unit of the FPGA device for driving an electronic switch thereof, in an embodiment of the present invention, wherein phase-change material based elements are exploited as programmable non-volatile storage elements.

With reference in particular to FIG. 2A, there is shown a generic control cell 200 of a FPGA control unit 125 for driving at least one associated electronic switch device 205 of the FPGA device 100 (included in one of the switch blocks 120), in an embodiment of the present invention.

Figure 2B:
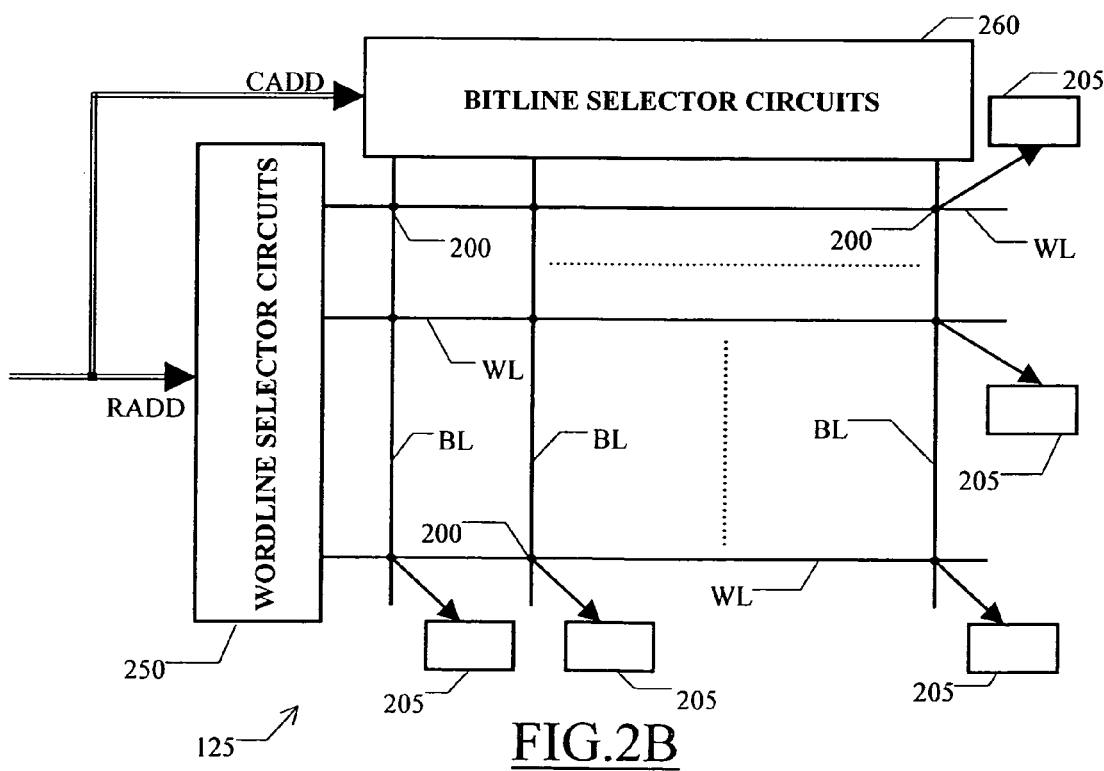
FIG. 2B shows, in a schematic way, a two-dimensional arrangement of the control cells of the FPGA control unit and the electrical connections between the control cells and the respective electronic switches.

As depicted schematically in FIG. 2B, the FPGA control unit 125 may include an arrangement of control cells 200 (typically, a two-dimensional disposition, or matrix), integrated in a same semiconductor chip together with the input/output blocks 105, the logic blocks 110, the switch blocks 120 and the interconnection segments 115. Each control cell 200 is associated with and drives at least one respective electronic switch 205. The control cells 200 are arranged in a plurality of lines and columns; a line of control cells 200 is controlled by a respective wordline WL and a column of control cells 200 is controlled by a respective bitline BL.

Wordline selector circuits 250 and bitline selector circuits 260 are also provided for selecting the wordlines WL and the bitlines BL. The wordline selector circuits 250 may include per-se known row decoder circuits for decoding a row address digital code RADD, and wordline driver circuits for selecting the desired wordline WL. Similarly, the bitline selector circuits 260 include per-se known column decoder circuits for decoding a column address digital code CADD and a bitline multiplexer for selecting the desired bitlines BL (also for the purpose of the present description the bitline selector circuits 260 are assumed to include programming circuits adapted to program the control cells 200).

In FIG. 2A the control cell 200 is connected to the wordline $WL_i$ and to the bitline $BL_j$ (indexes i, j identify a given wordline $WL_i$ and a given bitline $BL_j$, and thus one control cell 200 in the matrix); for selecting the control cell 200, appropriate voltages are applied to the wordline $WL_i$ and the bitline $BL_j$, as described in greater detail in the following.

The control cell 200 includes a n-MOS transistor M1 and a p-MOS transistor M2; the n-MOS transistor M1 has the gate terminal connected to the respective wordline $WL_i$ and the p-MOS transistor M2 has the gate terminal connected to the respective bitline $BL_j$. The transistors M1 and M2 have the drain terminals connected together and the p-MOS transistor M2 has the source terminal connected to a supply voltage line PL providing a supply voltage $V_{dd}$ (typically, 3 V).

The control cell 200 further includes a non-volatile programmable storage element P1, based on a phase-change material (Phase-Change Memory, or PCM, element). The phase-change material, typically consisting of a calcogenide (such as a $Ge_2Sb_2Te_5$ alloy) with resistivity changing at phase variations, is used for implementing a non-volatile memory device. The phase-change material can be reversibly switched between an amorphous, disordered phase and a crystalline, highly ordered phase. The two phases of the material exhibit different electrical characteristics; particularly, the material in the amorphous phase exhibits high resistivity and this phase can be associated with a first logic value, such as 0 (conventionally, reset state); the material in the crystalline phase exhibits low resistivity (about one hundred times lower than the resistivity of the material in the crystalline phase) and this phase can be associated with a second logic value, such as 1 (set state). Consequently, the phase-change material can be used for implementing a non-volatile memory element as the programmable storage element P1.

The particulars of phase change cells are well known in the art. Briefly stated, the phase of such a material is stable below a given temperature (such as 150° C.) and can be changed by heating the material above that temperature. From the electrical standpoint, it is possible to heat the phase-change material in the programmable storage element P1 by causing a current to flow through a resistive element (or heater) embedded in the storage element P1; in this way the heat generated by Joule effect heats the phase-change material accordingly.

Figure 3:
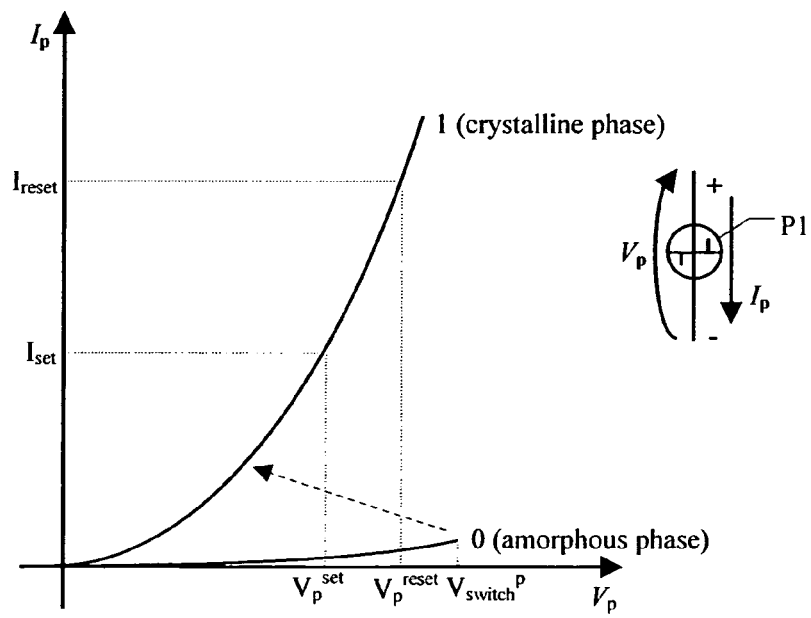
FIG. 3 shows the current-voltage (I-V) characteristic curves of a programmable non-volatile storage element used in the control cell of FIG. 2A.

Considering FIG. 3, current-voltage (I-V) characteristic curves of the programmable storage element P1 in the set and reset states are shown. A voltage between a negative terminal ("−" in the drawing) and a positive terminal ("+") of the programmable storage element P1 is referred to as $V_p$ and a current flowing from the positive terminal to the negative terminal is referred to as $I_p$.

If the current $I_p$, flowing through the programmable storage element P1, reaches a given set value $I_{set}$ (for example, 300 μA), the temperature of the phase-change material raises over a nucleation temperature (such as 200° C.) and, when cooled slowly, the phase-change material becomes crystalline. If the current $I_p$ is raised up to a given reset value $I_{reset}$, greater than the set value $I_{set}$ (roughly, $21_{set}$ and, for example, equal to 500 µA), the temperature of the phase-change material raises over a melting temperature (such as 600° C.) and, when cooled rapidly, the phase-change material becomes amorphous. The current values $I_{set}$, $I_{reset}$, used for programming the programmable storage element P1, are indicated on the I-V characteristic curve of the crystalline phase.

When the voltage $V_p$ is significantly lower than a switch value $V_{switch}^P$ (typically, approximately from 1 to 1.5 V), both the set and the reset states of the programmable storage element P1 are stable and the resulting value of the current $I_p$ is a signature of the resistivity of the phase-change material; the current $I_p$ thus corresponds to the stored logic value. In FIG. 3 the resulting I-V characteristic curves of the programmable storage element P1 outline the difference between the resistance exhibited when the logic value 0 is stored (high resistivity of the material in the amorphous phase) and when the logic value 1 is stored (low resistivity of the material in the crystalline phase).

During the operation of the FPGA device, if the phase-change material is in the amorphous phase (i.e., if the logic value 0 is stored), when the voltage $V_p$ exceeds the switch value $V_{switch}^P$, the resistivity of the phase-change material becomes very similar to the resistivity in the crystalline phase and the resulting current $I_p$ flowing through the programmable storage element P1 can modify the state of the phase-change material (that becomes crystalline). Consequently, it may happen that the logic value 1 is stored in place of 0; as a consequence, the voltage $V_p$ must not exceed the switch value $V_{switch}^P$ in order to avoid spurious programming.

Referring back to FIG. 2A, the programmable storage element P1 has the positive terminal connected to the source terminal of the n-MOS transistor M1 and the negative terminal connected to a reference voltage line providing a reference voltage (or a ground voltage).

The control cell 200 includes two inverters 210 and 215, particularly CMOS inverters, and a further n-MOS transistor M3. The input terminal of the inverter 210 (node DN in the drawing) is connected to the drain terminal of the transistors M1, M2 and to a first source/drain terminal of the transistor M3, while the output terminal of the inverter 210 is connected to the input terminal of the inverter 215; the output terminal of the inverter 215 is connected to a second source/drain terminal of the transistor M3. The transistor M3 receives an enabling signal EN at the gate terminal thereof; the enabling signal EN is generated inside the FPGA control unit 125 and can assume the value of the supply voltage $V_{dd}$, for turning the n-MOS transistor M3 on, or the value of the ground voltage, for turning the n-MOS transistor M3 off. In this configuration the n-MOS transistor M3 acts as a controlled switch, which can open or close a loop formed by the two inverters 210, 215; when the loop 210, 215 is closed, the two inverters 210, 215 implements a volatile storage element (a latch) similar to a memory cell of a Static RAM memory (a volatile memory device).

The control cell 200 is connected to the electronic switch 205 associated therewith by the output terminal of the inverter 210 and the input terminal of the inverter 215 (node D in the drawing). The electronic switch 205 can be implemented, for example, by a n-MOS transistor S1n in the transmission gate configuration. The two source/drain terminals of the transistor S1n are respectively connected to conductive lines $115_1$ and $115_2$ of the FPGA device 100, while the control cell 200 drives the electronic switch 205 by applying a control signal CTR to the gate terminal of the transistor S1n.

During a FPGA programming operation, when it is necessary to write a configuration logic value into the programmable storage element P1, the respective wordline $WL_i$ and bitline $BL_j$ are set at appropriate voltages by the wordline and bitline selector circuits 250, 260, respectively; the wordline $WL_i$ and the bitline $BL_j$ are set at voltages allowing the flow through the programmable storage element P1 of a current such that a phase change can occur. In particular, the bitline $BL_j$ is set at a voltage, such as the ground voltage, that allows turning the p-MOS transistor M2 on. In addition, the enabling signal EN is set at the ground voltage, in order to turn the n-MOS transistor M3 off and thus keep the loop 210, 215 open; in this way, the two inverters 210, 215 are not allowed to latch any logic value during the programming operation.

If the logic value 0 has to be written into the control cell 200, a reset voltage $V_{reset}^{WL}$ (typically, 3 V) is applied to the wordline $WL_i$; the reset voltage $V_{reset}^{WL}$ at the gate terminal of the n-MOS transistor M1 has to assure the flow of the reset current $I_{reset}$ through the programmable storage element P1 irrespective of the possible state of the phase-change material. Referring to FIG. 3, the switch value $V^{switchP}$ is higher than a voltage $V_p^{reset}$ corresponding to the reset current $I_{reset}$ in the crystalline phase, but the reset voltage $V_{reset}^{WL}$ has to be higher than the voltage $V_{switch}^P$ for assuring a phase change in the case in which the material is in the amorphous phase. Consequently, a current limiting device, for example the p-MOS transistor M2 driven by a suitable bitline voltage, is used to limit the current to the reset value $I_{reset}$. In the case in which the switch value $V^{switchP}$ is lower than the voltage $V_p^{reset}$ corresponding to the reset current $I_{reset}$, the use of the current limiting device is not necessary. The phase-change material, when rapidly cooled by rapidly decreasing the reset voltage $V_{reset}^{WL}$ at the gate terminal of the n-MOS transistor M1, amorphizes exhibiting high resistance.

If the logic value 1 has to be written into the control cell 200, a set voltage $V_{set}^{WL}$ (typically, 1.5 V) is applied to the wordline $WL_i$. The set voltage $V_{set}^{WL}$ at the gate terminal of the transistor M1 has to assure the flow of the set current $I_{set}$ through the programmable storage element P1 irrespective of the possible state of the phase-change material. Referring to FIG. 3, the switch value $V_{switch}^P$ is higher than the voltage $V_p^{set}$ corresponding to the set current $I_{set}$ in the crystalline phase, but the set voltage $V_{set}^{WL}$ has to be at least equal to the switch value $V_{switch}^P$ for assuring a phase change in the case in which the material is in the amorphous phase. Consequently, the current limiting device is used to limit the current to the set value $I_{set}$. In the case in which the switch value $V_{switch}^P$ is roughly equal to the voltage $V_p^{set}$ corresponding to the set current $I_{set}$, the use of the current limiting device is not necessary. The phase-change material, when slowly cooled by slowly decreasing the voltage at the gate terminal of the n-MOS transistor M1, crystallizes exhibiting low resistance.

The supply voltage line PL can be also used as a verify line, enabling, for example, a Direct Memory Access (DMA) to the programmable storage element P1 of a selected control cell 200 in the matrix (selected by the wordline and bitline selector circuits 250 and 260), for establishing the status thereof by sensing the current.

After the programming operation, the configuration logic value, stored in the programmable storage element P1, needs to be transferred at the node DN (transferring operation). For example, the bitline $BL_j$ is left to the ground voltage, while the wordline $WL_i$, controlling the n-MOS transistor M1, has to be brought a voltage lower than that in the programming operation. More generally, the bitline $BL_j$ is biased to a voltage such that the p-MOS transistor M2 is turned on and the node DN can be driven by the current flowing through the programmable storage element P1. During this transferring operation the enabling signal EN is kept at the ground voltage and then the loop 210, 215 is kept open.

The voltage of the wordline $WL_i$ is brought to a transferring value $V_T$ (typically, about 0.8 V) lower than the switch value $V_{switch}^P$, in order to prevent any spurious programming of the programmable storage element P1 during the transferring operation, but suitable to keep the n-MOS transistor M1 turned on; then, the transferring value $V_T$ needs to be higher than the threshold voltage of the transistor M1.

The programmable storage element P1 exhibits high resistance when the logic value 0 is stored therein and the p-MOS transistor M2 pulls the voltage at the node DN up towards the value of the supply voltage $V_{dd}$, that can be associated by convention to the logic value 1. On the contrary, the programmable storage element P1 exhibits low resistance when the logic value 1 is stored therein, and the n-MOS transistor M1 pulls the voltage at the node DN down towards the ground voltage, that is associated by convention to the logic value 0.

After the transferring operation, the enabling signal EN is set at the supply voltage $V_{dd}$ and the n-MOS transistor M3 turns on, closing the loop 210, 215. In a way similar to a volatile SRAM cell the loop 210, 215 quickly latches the logic value corresponding to the value of the voltage at the node DN. The control signal CTR corresponds to a negation of the logic value at the node DN: if the node DN is at the logic value 1, the control signal CTR is at the logic value 0, and vice versa.

Consequently, when the programmable storage element P1 stores the logic value 1, also the control signal CTR assumes the logic value 1, i.e., a voltage value close to the value of the supply voltage $V_{dd}$, and allows turning the electronic switch 205 on, enabling a respective interconnection $115_1$-$115_2$ in the FPGA device 100, formed by the conductive lines $115_1$ and $115_2$ connected together. Otherwise, when the programmable storage element P1 stores the logic value 0, the control signal CTR assumes the logic value 0, i.e., a voltage close to the ground voltage, and allows the electronic switch 205 to be turned off, keeping disabled the respective interconnection $115_1$-$115_2$ in the FPGA device 100.

It is observed that the transferring operation is required not only after the programming operation, but also at every power-on of the FPGA device 100. However, the simple structure of the control cell 200, that combines the properties of both non-volatile and volatile memory elements, permits a fast transferring operation, lasting only a few tens of nanoseconds; in addition, a re-programming operation of the FGPA device can be accomplished very easily.

The FPGA control unit 125 according to the present invention does not need the use of a complex architecture with two different memory devices, one of non-volatile and one of volatile type, and it is easily embedded in the FPGA device by pre-existing fabrication processes of integrated circuits.

Furthermore, the exploitation of components made by a phase-change material permits the implementation of a control unit intrinsically hard to radiations, easily re-programmable and even faster.

The concepts of the present invention apply also when the control cell includes equivalent components or different number and type of transistors, or when the p-MOS transistors substitute the n-MOS transistors, and vice versa. Alternatively, the control unit can include a different disposition of control cells, such as a linear disposition, or can also include only one control cell.

The electronic switches enabling the setting up of interconnections of the FPGA device can be implemented in different ways, for example using a different number of transistors and CMOS design.

Figure 1A:
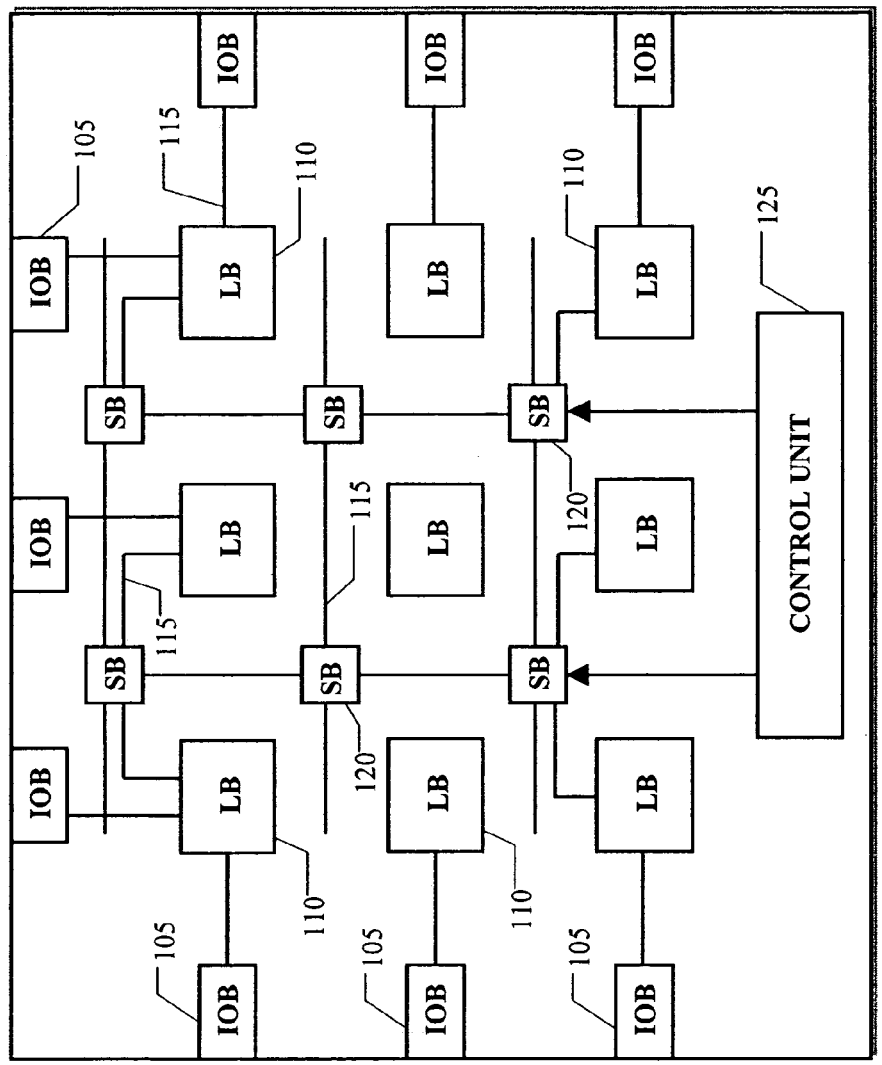
FIG. 1A is a schematic block diagram of a FPGA device in which the present invention is applicable.
Figure 1B:
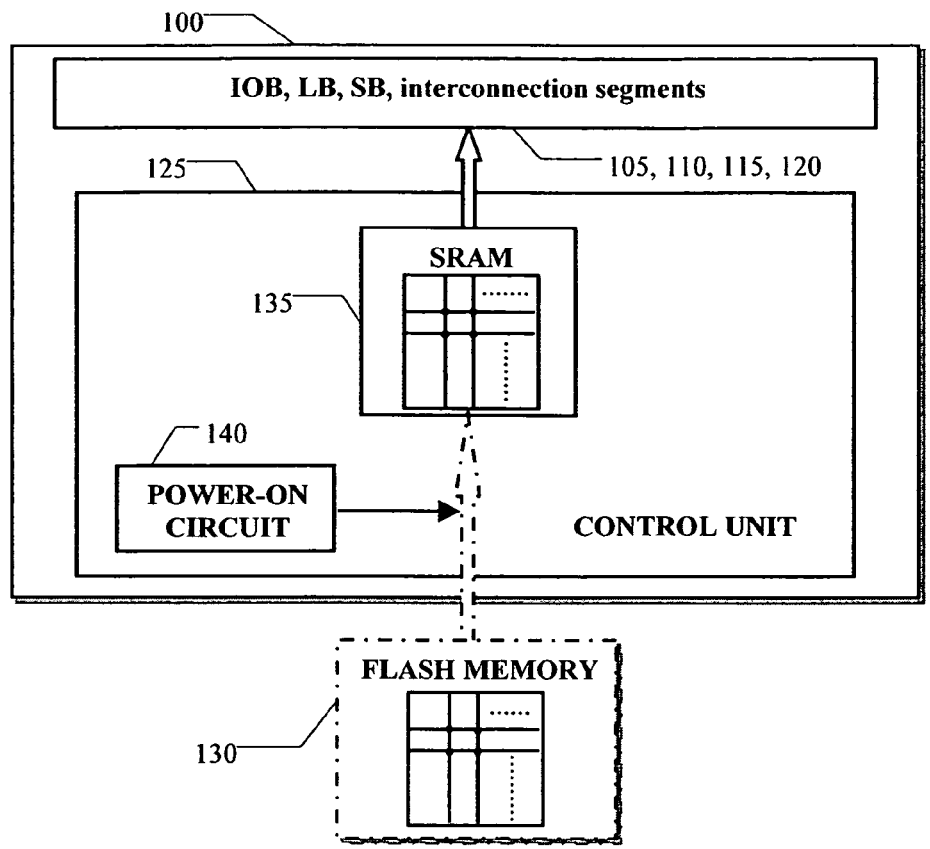
FIG. 1B illustrates a basic structure of a FPGA device control unit known in the art.
Figure 4A:
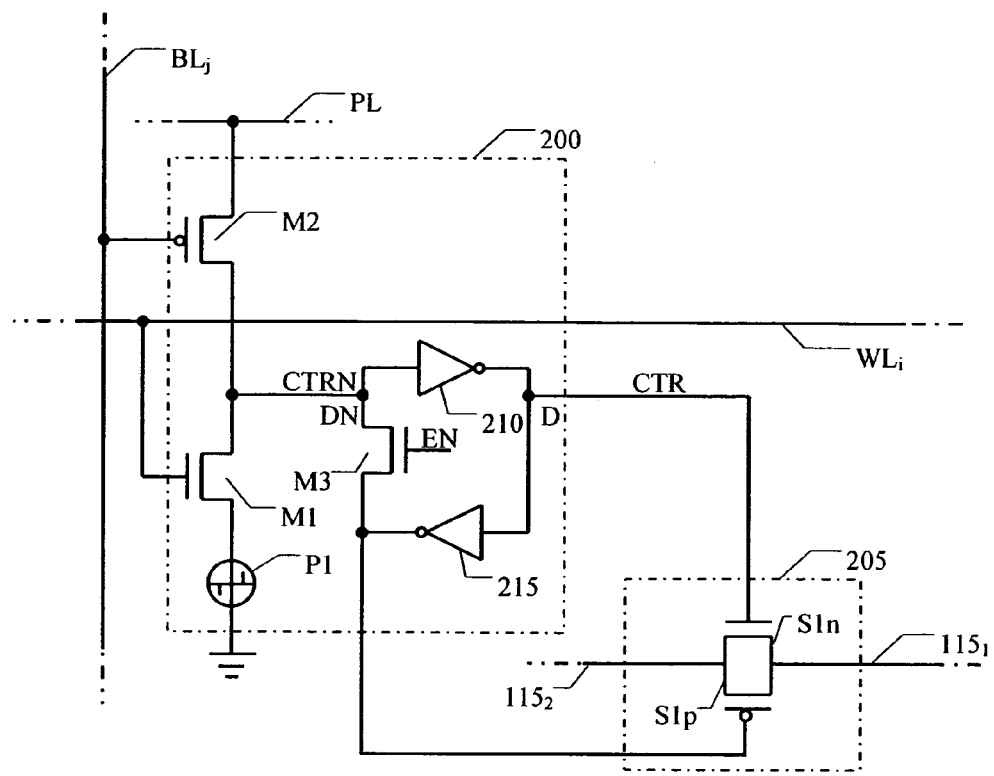
FIG. 4A illustrates an alternative embodiment of the electronic switch driven by the control cell of FIG. 2A.

Referring to FIG. 4A, an alternative embodiment of the electronic switch 205 driven by the control cell 200 is illustrated (the elements corresponding to those in FIGS. 1A and 2A are denoted with the same reference numerals and their description is omitted for the sake of conciseness).

The electronic switch 205 includes, in addition to the n-MOS transistor S1n, a p-MOS transistor S1p with the two source/drain terminals connected to the two source/drain terminals of the n-MOS transistor S1n; consequently, the p-MOS transistor S1p is connected to the conductive lines $115_1$, $115_2$ of the FPGA device 100 as the n-MOS transistor S1n.

The p-MOS transistor Sp1 is controlled by a further control signal that is the logic complement of the control signal CTR; such a signal is, for example, a complemented control signal CTRN derived from the output of the inverter 215. When the programmable storage element P1 stores the logic value 1, the complemented control signal CTRN takes the logic value 0 and the control signal CTR takes the logic value 1, then both the transistors S1n, S1p are turned on.

The utilization of the p-MOS transistor S1p is justified by the fact that p-MOS transistors ensure a better transfer efficiency of logic 1s, making the response of the electronic switch 205 to the control signal CTR more efficient.

In another embodiment, the p-MOS transistor S1p can receive the complemented control signal CTRN through a further inverter connected between the gate terminals of the two transistors S1n, S1p, but this solution can introduce a time delay.

Figure 4B:
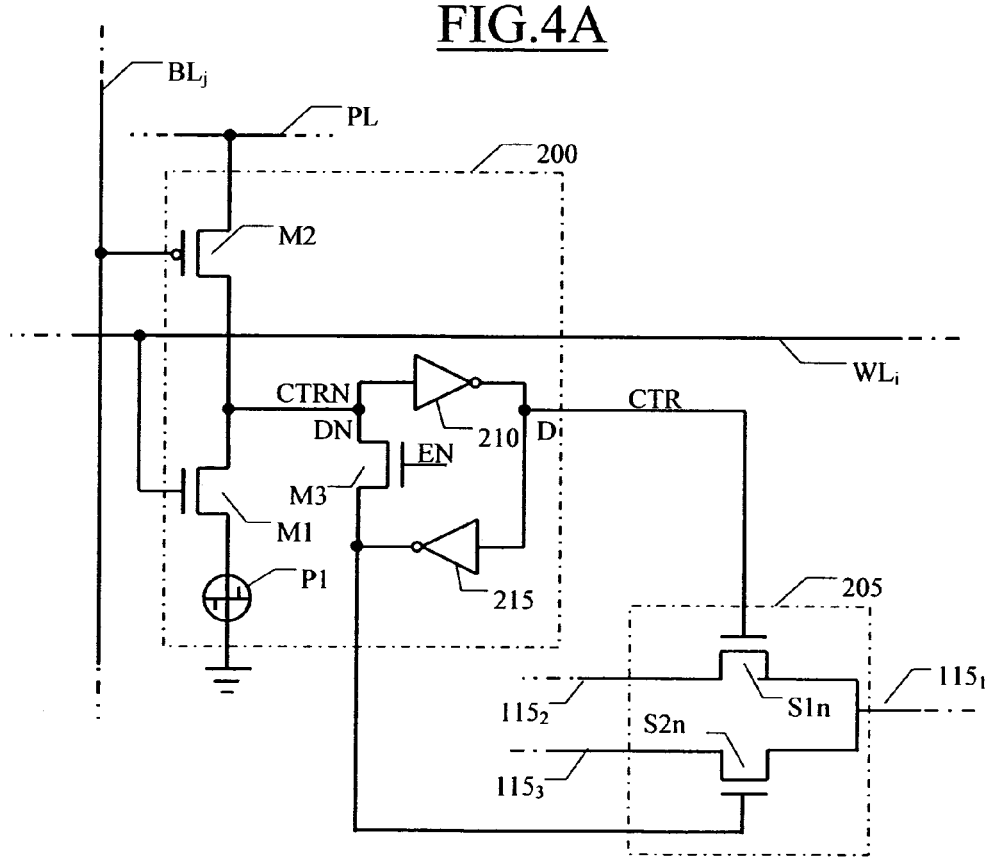
FIG. 4B shows a further alternative embodiment of the electronic switch driven by the control cell of FIG. 2A.

Referring now to FIG. 4B, a further alternative embodiment of the electronic switch 205 driven by the control cell 200 is shown.

In addition to the n-MOS transistor S1n, a further n-MOS transistor S2n is provided having a first source/drain terminal connected to the conductive line $115_1$ as the n-MOS transistor S1n, while a second source/drain terminal is connected to a further conductive line $115_3$. The gate terminal of the n-MOS transistor S2n is connected to the output terminal of the inverter 215 for receiving the complemented control signal CTRN. In this way, when the n-MOS transistor S1n turns on, the n-MOS transistor S2n turns off, and vice versa. In this configuration, the electronic switch 205 acts as a 2-to-1 multiplexer, which selectively enables an interconnection $115_1$-$115_2$ or an interconnection $115_1$-$115_3$ of the FPGA device 100.

Figure 4C:
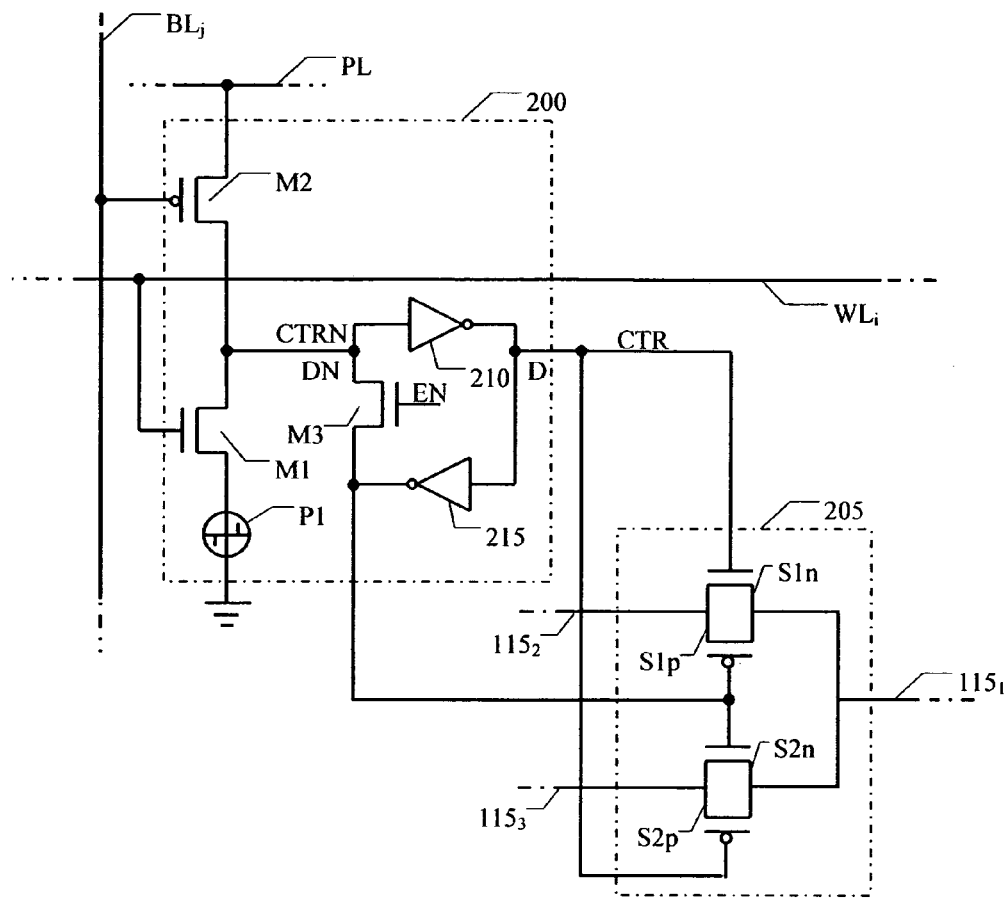
FIG. 4C illustrates a simple variation of the electronic switch of FIG. 4B.

Considering now FIG. 4C, a simple variation of the electronic switch 205 of FIG. 4B is illustrated.

Two further p-MOS transistors S1p and S2p are included; the p-MOS transistors S1p and S2p are connected in the same way described with reference to the p-MOS transistor S1p in FIG. 4A and, in this case, the gate terminals of the transistors S1p and S2n are connected together to the output terminal of the inverter 215 for receiving the complemented control signal CTRN. Each one of the two source/drain terminals of the p-MOS transistor S2p is connected to a corresponding source/drain terminal of the n-MOS transistor S2n, while the gate terminal is connected to the node D, then to the output terminal of the inverter 210, for receiving the control signal CTR. In this way the electronic switch 205 acts as a CMOS multiplexer, which selectively enables the interconnection $115_1$-$115_2$ or the interconnection $115_1$-$115_3$.

Many other different structures of the electronic switch 205 can be driven by the control cell 200 according to the present invention and, in addition, more than one electronic switch can receive the control signal CTR (and the complemented control signal CTRN) provided by the control cell 200.

Figure 5:
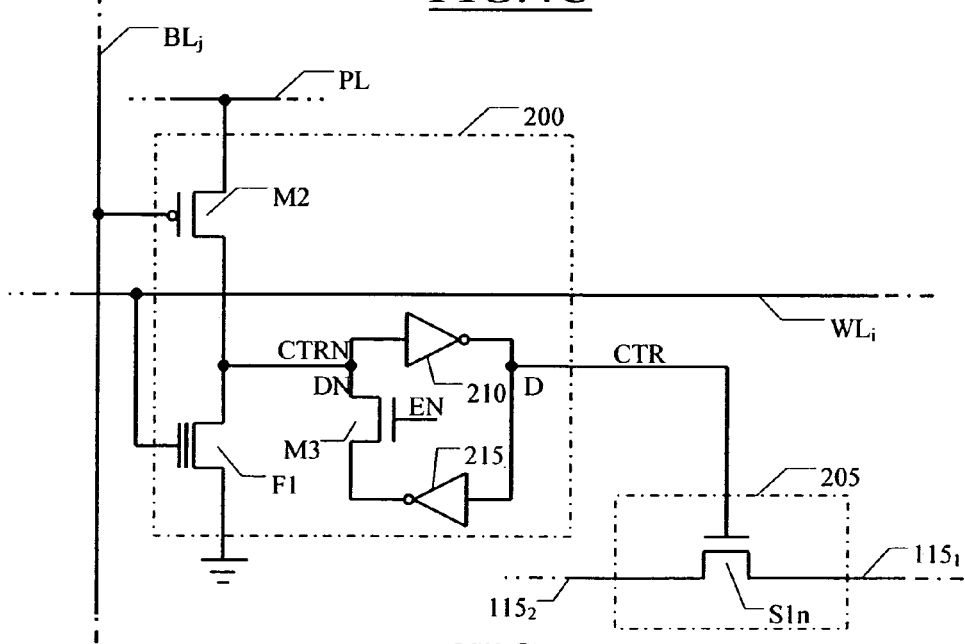
FIG. 5 shows a switch control cell according to an alternative embodiment of the present invention, in which a floating gate transistor is used as a non-volatile storage element.

With reference to FIG. 5, a control cell 200 according to another embodiment of the present invention is shown, in which a floating gate transistor is used as a non-volatile programmable storage element instead of the PCM element (the elements corresponding to those in FIGS. 1A and 2A are denoted with the same reference numerals and their description is omitted for the sake of simplicity).

In greater detail, the non-volatile programmable storage element P1, based on a phase-change material, and the n-MOS transistor M1 shown in FIG. 2A are replaced by a floating gate transistor F1, typically of the type used as memory cell in flash memories. The transistor F1 has the control gate terminal connected to the wordline $WL_i$, the drain terminal connected to the drain terminal of the p-MOS transistor M2 and the source terminal connected to ground. The floating gate transistor F1 can be programmed by applying suitable voltage to the wordline $WL_i$ and to the bitline $BL_j$, permitting to change the threshold voltage thereof by hot-electron injection or tunneling, that can be associated to a configuration logic value. Then, the current flowing in the floating gate transistor F1 is a signature of the threshold voltage thereof; in this way, the floating gate transistor acts as a non-volatile programmable storage element. Compared to the previous embodiment, the operative voltages applied to the wordline $WL_i$ and to the $BL_j$ have to be modified accordingly.

Other types of programmable non-volatile storage elements can be used in substitution of the PCM element or the floating gate transistor, e.g., MOS transistors in which an electric charge can be trapped in a charge-trapping layer.

Naturally, in order to satisfy local and specific design requirements, a person skilled in the art may apply to the solution described above many modifications and alterations all of which, however, are included within the scope of protection of the invention as defined by the following claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A Field Programmable Gate Array comprising:
   a plurality of configurable electrical connections;
   a plurality of controlled switches, each structured to activate/de-activate a respective one of the electrical connections in response to a switch control signal; and
   a control unit including an arrangement of a plurality of control cells each controlling at least one of said controlled switches by the respective switch control signal, each control cell including a volatile storage element adapted to storing in a volatile way a control logic value corresponding to a preselected status of the at least one controlled switch, and providing to the controlled switch said switch control signal corresponding to the stored logic value, each control cell further including a non-volatile storage element coupled to the volatile storage element, the non-volatile storage element being adapted to storing in a non-volatile way the control logic value.

2. The Field Programmable Gate Array according to claim 1, wherein the non-volatile storage element is a programmable storage element.

3. The Field Programmable Gate Array according to claim 2, wherein the non-volatile storage element of each control cell includes a Phase-Change Memory element.

4. The Field Programmable Gate Array according to claim 1, wherein the arrangement of the plurality of control cells includes at least one alignment of control cells, said at least one alignment being controlled by a corresponding first line, each control cell in said at least one alignment being controlled by a corresponding second line, the control cells being univocally identified by the corresponding first line and the corresponding second line.

5. The Field Programmable Gate Array according to claim 4, wherein the arrangement of the plurality of control cells is two-dimensional and organized in at least one row of control cells and in at least one column of control cells, the at least one row being controlled by the corresponding first line and the at least one column being controlled by the corresponding second line.

6. The Field Programmable Gate Array according to claim 1, wherein the electrical connections are re-configurable by re-programming the non-volatile storage elements of the plurality of the control cells.

7. The Field Programmable Gate Array according to claim 1, wherein each controlled switch includes at least one variable conductivity element for activating/de-activating a respective electrical connection in response to the control signal provided by the corresponding volatile storage element.

8. The Field Programmable Gate Array according to claim 7, wherein each controlled switch further includes at least one further variable conductivity element for activating/de-activating a respective further electrical connection in response to the logic complement of the control signal, the electrical connection and the further electrical connection being activated in a mutually exclusive way.

9. The Field Programmable Gate Array according to claim 7, wherein each variable conductivity element includes a first pass transistor and a second pass transistor, the first pass transistor being responsive to the control signal or to the logic complement of the control signal and the second pass transistor being responsive to another between the control signal and the logic complement of the control signal.

10. A method of driving at least one controlled switch of a Field Programmable Gate Array comprising a control unit, the control unit including an arrangement of a plurality of control cells, the method including:
    loading into a volatile memory element included in each control cell a control logic value previously stored in a non-volatile way;
    providing a switch control signal corresponding to the control logic value to the at least one controlled switch; and
    storing some other control logic value that was previously stored in the volatile memory element in a non-volatile storage element that is coupled to the volatile memory element in each control cell.

11. The method according to claim 10 wherein the some other control logic value is identical to said control logic value previously stored in a non-volatile way.

12. A field programmable gate array comprising:
    a plurality of logic blocks;

a switch coupled between two respective logic blocks that selectively connects or disconnects one logic block to the other logic block;

configuration logic coupled to a control terminal of the switch, the configuration logic including cross-coupled inverters and a programmable, non-volatile memory cell that stores a value to connect or disconnect the logic blocks to each other; and an enable switch coupled between the cross-coupled invertors wherein the enable switch coupled between the cross-coupled inverters is open when the value to connect or disconnect the logic blocks to each other is transferred to the cross-coupled inverters.

13. The array according to claim 12 wherein the enable switch coupled between the cross-coupled inverters is closed after the value to connect or disconnect the logic blocks to each other has been transferred to the cross-coupled inverters.

14. The array according to claim 12 wherein the cross-coupled inverters function as a volatile storage element.

15. The array according to claim 12 wherein the switch further comprises a plurality of MOS transistors.

16. The array according to claim 12 wherein the switch further comprises a first terminal and a second terminal.

17. The array according to claim 16 wherein the first terminal is electrically connected directly to the one logic block, and the second terminal is electrically connected directly to the other logic block.

18. A Field Programmable Gate Array comprising:
a plurality of configurable electrical connections;
a plurality of controlled switches, each structured to activate/de-activate a respective one of the electrical connections in response to a switch control signal; and
a control unit including an arrangement of a plurality of control cells each in direct control of at least one of said controlled switches by the respective switch control signal, each control cell including a volatile storage element adapted to store in a volatile way a control logic value corresponding to a preselected status of the at least one controlled switch, and providing to the controlled switch said switch control signal corresponding to the stored logic value, each control cell further including a non-volatile storage element coupled to the volatile storage element, the non-volatile storage element being adapted to store in a non-volatile way the control logic value.

19. A Field Programmable Gate Array comprising:
a plurality of configurable electrical connections;
a plurality of controlled switches, each structured to activate/de-activate a respective one of the electrical connections in response to a switch control signal; and
a control unit including a plurality of control cells each adapted to control at least one of said controlled switches by the respective switch control signal, each control cell including a volatile storage element adapted to store in a volatile way a control logic value corresponding to a status of the at least one controlled switch, and providing to the controlled switch said switch control signal corresponding to the stored logic value, each control cell further including a non-volatile storage element coupled to the volatile storage element, the non-volatile storage element being adapted to store in a non-volatile way the control logic value, wherein in each control cell the non-volatile storage element is coupled to the volatile storage element in such a way that the control logic value stored in a non-volatile way in the non-volatile storage element is transferable to an input terminal of the volatile storage element.

20. The Field Programmable Gate Array according to claim 19, wherein the control cell includes an enabling element activatable to enable the volatile storage element to load therein the control logic value present at the input terminal thereof.

21. The Field Programmable Gate Array according to claim 20, wherein the volatile storage element comprises a circuit loop, and the enabling element is inserted in the circuit loop to selectively open/close the circuit loop.

22. A Field Programmable Gate Array compnsing:
a plurality of configurable electrical connections;
a plurality of controlled switches, each structured to activate/de-activate a respective one of the electrical connections in response to a switch control signal; and
a control unit including an arrangement of a plurality of control cells each controlling at least one of said controlled switches by the respective switch control signal, each control cell including a volatile storage element adapted to store in a volatile way a control logic value corresponding to a status of the at least one controlled switch, and providing to the controlled switch said switch control signal corresponding to the stored logic value, each control cell further including a non-volatile storage element coupled to the volatile storage element, the non-volatile storage element being adapted to store in a non-volatile way the control logic value, the non-volatile storage element of each control cell including an electrically-modifiable threshold voltage transistor.

23. The Field Programmable Gate Array according to claim 22, wherein the electrical connections are re-configurable by re-programming the non-volatile storage element coupled to the volatile storage element.

24. A Field Programmable Gate Array comprising:
a plurality of logic blocks;
a switch coupled between two respective logic blocks that selectively connects or disconnects one logic block to the other logic block, said switch includes at least one n-channel MOS transistor and one p-channel MOS transistor;
configuration logic coupled to the switch, the configuration logic including a programmable, non-volatile memory cell that stores the value to connect or disconnect the logic blocks to each other, the configuration logic including cross-coupled inverters; and
an enable switch coupled between the cross-coupled invertors.

25. The Field Programmable Gate Array according to claim 24, wherein the non-volatile memory cell includes a Phase-Change Memory element.

* * * * *